(12) United States Patent
Bartray et al.

(10) Patent No.: US 7,130,019 B2
(45) Date of Patent: Oct. 31, 2006

(54) LITHOGRAPHIC APPARATUS AND DEVICE MANUFACTURING METHOD

(75) Inventors: Petrus Rutgerus Bartray, Ysselsteyn (NL); Wilhelmus Josephus Box, Eksel (NL); Carlo Cornelis Maria Luijten, Duizel (NL); Bernardus Antonius Johannes Luttikhuis, Nuenen (NL); Michael Ten Bhomer, Veghel (NL); Ferdy Migchelbrink, Amersfoort (NL); Jan Jaap Kuit, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/986,182

(22) Filed: Nov. 12, 2004

(65) Prior Publication Data

US 2005/0151954 A1    Jul. 14, 2005

Related U.S. Application Data

(63) Continuation-in-part of application No. 10/735,847, filed on Dec. 16, 2003.

(30) Foreign Application Priority Data

Nov. 13, 2003  (NL) .................................. 0300798

(51) Int. Cl.
- G03B 27/42 (2006.01)
- G03B 27/58 (2006.01)
- G03B 27/62 (2006.01)

(52) U.S. Cl. .............................. 355/53; 355/72; 355/75
(58) Field of Classification Search ................... 355/53, 355/67–76
See application file for complete search history.

(56) References Cited

U.S. PATENT DOCUMENTS

| | | | |
|---|---|---|---|
| 5,644,137 A | | 7/1997 | Waggener et al. |
| 6,020,950 A | * | 2/2000 | Shiraishi ....................... 355/30 |
| 6,118,599 A | | 9/2000 | Spinali |
| 6,208,408 B1 | * | 3/2001 | Takabayashi ................. 355/67 |
| 6,262,795 B1 | | 7/2001 | Baker et al. |
| 6,449,106 B1 | | 9/2002 | Spinali |
| 6,473,245 B1 | | 10/2002 | Spinali |
| 6,529,264 B1 | | 3/2003 | Ikeda |
| 6,538,720 B1 | | 3/2003 | Galburt et al. |
| 6,549,347 B1 | | 4/2003 | Spinali |
| 6,577,457 B1 | | 6/2003 | Spinali |
| 6,630,984 B1 | * | 10/2003 | Bisschops ..................... 355/30 |

(Continued)

FOREIGN PATENT DOCUMENTS

EP    0 844 532 A2    5/1998

(Continued)

OTHER PUBLICATIONS

Ray Ellis, "Dual Side Alignment Metrology Tool Proposal," Final Design Project, p. 1-32, (date unknown).

(Continued)

*Primary Examiner*—Henry Hung Nguyen
(74) *Attorney, Agent, or Firm*—Pillsbury Winthrop Shaw Pittman LLP

(57) ABSTRACT

A lithographic apparatus is provided that includes an illumination system for conditioning a beam of radiation, and a support for supporting a patterning device. The patterning device serves to impart the beam of radiation with a pattern in its cross-section. The apparatus also includes a substrate table for holding a substrate, a projection system for projecting the patterned beam onto a target portion of the substrate, an isolated reference frame for providing a reference surface, and a measuring system for measuring the substrate with respect to the reference surface. The reference frame includes a material having a coefficient of thermal expansion of greater than about $2.9 \times 10^{-6}$/K.

27 Claims, 8 Drawing Sheets

U.S. PATENT DOCUMENTS

| | | | |
|---|---|---|---|
| 6,674,512 B1 | 1/2004 | Novak et al. | |
| 6,822,727 B1 * | 11/2004 | Shima | 355/53 |
| 6,875,992 B1 * | 4/2005 | Castenmiller et al. | 250/548 |
| 2002/0154839 A1 | 10/2002 | Trost | |
| 2003/0112445 A1 | 6/2003 | Evans et al. | |

FOREIGN PATENT DOCUMENTS

| | | |
|---|---|---|
| EP | 0 844 532 A3 | 8/1999 |
| EP | 1 178 357 A1 | 2/2002 |
| EP | 1 341 044 A2 | 9/2003 |
| JP | WO99/28957 | 6/1999 |
| WO | WO 02/21207 A1 | 3/2002 |

OTHER PUBLICATIONS

Julio A. Navarro and Kai Chang, "Broadband Electronically Tunable IC Active Radiating Elements and Power Combiners," Microwave Journal, Texas A & M University (College Station, TX), No. 10, p. 87-101, (Oct. 1992).

Glen A. Slack and S. F. Bartram, "Thermal Expansion of Some Diamondlike Crystals," Journal of Applied Physics, American Institute of Physics, vol. 46 (No. 1), p. 89-98, (Jan. 1975).

Comparison of Materials: Coefficient of Thermal Expansion http://webarchive.org/web/20030903155147/www.handyharmancanada.com/thebrazingbook/comparis.htm, (date unknown).

* cited by examiner

LITHOGRAPHIC APPARATUS AND DEVICE MANUFACTURING METHOD

CROSS-REFERENCE TO RELATED APPLICATIONS

This application is a continuation-in-part of U.S. patent application Ser. No. 10/735,847, filed Dec. 16, 2003, which is based on and claims the benefit of priority from International Patent Application No. PCT/NL03/00798, filed Nov. 13, 2003, the entire contents of which are both incorporated herein by reference. This application also claims the benefit of priority from International Patent Application No. PCT/NL03/00798, filed Nov. 13, 2003.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Lithographic apparatus include a reference frame, which may also be referred as a metrology frame in the art. The reference frame provides support for the projection system. In certain types of conventional lithographic apparatus the reference frame is isolated from disturbances caused by other components of the lithographic apparatus, such as the long and short stroke motors used to drive the reticle and wafer stages. Reference frames are conventionally made from materials having a low coefficient of thermal expansion, such as alloys including INVAR®. Until now, it has been assumed that such materials having a low coefficient of thermal expansion are used in order to meet the thermal demands of the reference frame. Unfortunately, these materials are expensive resulting in a high manufacture cost. Furthermore, such materials are in limited supply and have a limited manufacturability. Operating in a dynamic market of supply and demand, these factors may contribute to an unacceptably long lead time for the production of a reference frame. Such a long lead time also includes a large expense in terms of the man hours required to construct the reference frame due to the sub-optimal manufacturability of conventional reference frame materials. Due to problems in supply and demand of reference frames, it has been found that it may not be possible to supply reference frames in sufficiently high volume in a market upturn, thereby losing output, and it may not be possible to reduce output volume in a market down-turn, thereby forcing goods to remain in storage.

U.S. Pat. No. 6,529,264 discloses a frame for connecting parts of an optical system, that includes two barrels disposed on top of their own flange-connection to an assembly frame. The patent addresses the problem that movements between certain points of the optical axis that are relatively weakly connected may result in imaging performance loss. In particular, this patent addresses the problem of reducing these movements in the frame. It would appear that the frame is made of materials including aluminium and stainless steel. The frame does not constitute a reference frame, but can be seen as part of a projection optics assembly, where it provides the function of improving the imaging performance of this assembly. This patent thus indicates a technical prejudice that frames for lithographic apparatus made of non-low thermal expansion coefficient materials, such as aluminium, suffer vibrations that may detrimentally affect the performance of the lithographic apparatus, and that may need additional solutions. This patent implies that the frame disclosed would not be suitable as a reference frame due to the vibrations suffered. In U.S. Pat. No. 6,529,264, the solution includes providing an additional frame. The provision of an additional frame produces an overdetermined construction, because a single lower assembly frame may be sufficient. To overcome the mechanical problems of overdetermination, the solution would be to make the frame a separate part that is only stiff in limited directions, and to connect it after the two barrels are positioned to each other through the assembly frame, as proposed in U.S. Pat. No. 6,529,264. Further, the thermo-dynamical problems of an overdetermined assembly would be to make the materials of the frame parts and the assembly frame part the same, also as proposed in U.S. Pat. No. 6,529,264.

SUMMARY

It is an aspect of the present invention to overcome the problems associated with the supply of conventional reference frame materials, without encountering performance problems in return.

According to an embodiment of the invention, there is provided a lithographic apparatus that includes an illumination system for providing a projection beam of radiation, and a support structure for supporting a patterning device. The patterning device serves to impart the projection beam with a pattern in its cross-section. The apparatus also includes a substrate table for holding a substrate, a projection system for projecting the patterned beam onto a target portion of the substrate, and an isolated reference frame for providing a reference surface with respect to which the substrate is measured, characterized in that the reference frame includes a material having a high coefficient of thermal expansion.

By providing a reference frame including a material having a high coefficient of thermal expansion, a wider variety of materials are available for the reference frame. It has been found that materials, such as aluminium or aluminium alloy materials, may result in a significant cost of goods reduction and a significant lead-time decrease. Further, the present invention provides the additional surprising effect that the dynamic performance of the reference frame is equal or better than reference frames made of conventional materials, such as INVAR®. By rejecting the assumption that a reference frame must be constructed of a material having a low coefficient of thermal expansion in order to achieve the required thermal and thermo-dynamic performance, the inventors have overcome substantial technical prejudice.

In an embodiment, the reference frame supports a measuring system for determining certain dimensions of the substrate prior to its exposure and the projection system.

In an embodiment, the coefficient of thermal expansion is greater than approximately $2.9\times10^{-6}$/K.

In an embodiment, a lithographic apparatus is provided. The apparatus includes an illumination system for conditioning a beam of radiation, and a support for supporting a patterning device. The patterning device serves to impart the beam of radiation with a pattern in its cross-section. The apparatus also includes a substrate table for holding a substrate, a projection system for projecting the patterned beam onto a target portion of the substrate, an isolated reference frame for providing a reference surface, and a measuring system for measuring the substrate with respect to the reference surface. The reference frame includes a material having a coefficient of thermal expansion of greater than about $2.9\times10^{-6}$/K.

Surprisingly, it has been found that materials having a coefficient of thermal expansion of greater than approximately $2.9\times10^{-6}$/K provide a reference frame having sufficient mechanical and thermal stability. It has been found that SiSiC, having a coefficient of thermal expansion of approximately $2.9\times10^{-6}$/K, is a material that has sufficient mechanical and thermal stability.

In an embodiment, the reference frame includes any one of the materials aluminium, aluminium alloy, titanium, iron, cast-iron, steel, stainless steel, copper, a ceramic material, concrete, granite, porcelain or combinations of these materials, for example, in a composite, sandwich or laminated structure. By using such materials the production costs of the reference frame may be reduced. Further, an increase in design freedom may be provided. The use of more versatile materials may result in less technical production documentation, with less mechanical development for design changes in the reference frame, and new frame designs. In particular, it has been found that aluminium or aluminium alloy, for example, are particularly dynamically robust.

In an embodiment, the reference frame includes a solid block of material. By providing a reference frame in the form of a solid block, the manufacturability of the reference frame may be further improved in contrast to conventional reference frames, which may include a large number of casting or plate parts that are welded together. Further, a solid block provides a low internal thermal resistance and high thermal capacity. This results in only small temperature fluctuations from dynamic heat load variations and as a result small thermal drift of the reference frame.

In an embodiment, the solid block is machined to form the reference frame. By machining a solid block, time consuming and expensive welding procedures may be avoided.

In an embodiment, the reference frame is provided with a thermal conditioning system for controlling the temperature of the projection system with respect to the reference frame. By providing such a thermal conditioning system, the long term thermal stability of the reference frame may be improved. Further, after thermal drift of the reference frame and the optical system (caused for example by a service, maintenance or installation, etc.), the thermal stabilization to reach the required performance may be significantly reduced by active cooling. Another advantage is the improved thermal conditioning of the projection system that is provided with an actively conditioned reference frame.

In an embodiment, the reference frame is provided with a highly infrared reflective surface. By providing the reference frame with a highly infrared reflective surface, the contamination risk may be reduced, and/or the infrared reflection may be increased, and/or the friction coefficient can be enlarged. In particular, the surface may be provided in the form of a coating of a metal material of, for example, nickel.

In an embodiment, the reference frame is made of a material having a high specific heat and/or a high thermal conductivity. In particular, a material having a specific heat higher than about 600 J(kgK) and/or the thermal conductivity higher than about 20 W/(m K). By providing of reference frame of a material having a high specific heat and/or a high thermal conductivity, the thermal stability of the frame may be improved.

In an embodiment, the reference frame is provided with a first temperature sensor for sensing a temperature of the reference frame.

In an embodiment, the projection system includes a projection lens. The projection lens is provided with a second temperature sensor for sensing a temperature of the projection lens.

In an embodiment, the appratus includes a thermal conditioning system for thermally conditioning at least one of the reference frame and the projection system based on the temperatures sensed by at least one of the first and second temperature sensors. In this way, both short and long term temperature fluctuations may be compensated for.

In an embodiment, the thermal conditioning system includes a control circuit for controlling an amount of heat transported to or from at least one of the reference frame and projection lens, a temperature regulating element, and a heat transporting system. The temperature regulating element regulates the amount of heat transported by the heat transporting system. The heat transporting system is in thermal contact with at least one of the reference frame and the projection lens, for transporting heat to or from the at least one of the reference frame and the projection lens. The control circuit is arranged to be responsive to the temperature sensed by at least one of the first and second temperature sensors. The temperature regulating element is responsive to the control circuit and is in thermal contact with the heat transporting system, so that a set temperature is reached in at least one of the reference frame and the projection lens. In this way, the temperature control of at least one of the reference frame and projection lens may be improved.

In an embodiment, the control circuit is arranged to take the temperature sensed by the first temperature sensor into account in compensating for a short term environmental temperature fluctuation. In this way, the thermal stability of the apparatus may be improved.

In an embodiment, the control circuit is arranged to take the temperature sensed by the second temperature sensor into account in compensating for a long term environmental temperature fluctuation. In this way, the thermal stability of the apparatus may be further improved.

In an embodiment, the thermal conditioning system includes a single control loop for controlling the temperature of the reference frame and the projection lens. In this way, both the long and short term environmental temperature fluctuations may be accounted for, without adding significantly to the complexity and cost of the apparatus.

In an embodiment, the heat transporting system includes a conditioning fluid that is heated or cooled to the set temperature. In this way, the thermal conditioning system may provide a versatile and effective temperature control of the apparatus.

According to a further aspect of the invention, there is provided a device manufacturing method that includes providing a substrate, providing a projection beam of radiation using an illumination system, using a patterning device to impart the projection beam with a pattern in its cross-section, projecting the patterned beam of radiation onto a target portion of the substrate, and using an isolated reference frame to provide a reference surface with respect to which the substrate is measured, characterized in that the reference frame includes a material having a high coefficient of thermal expansion.

In an embodiment, a device manufacturing method is provided. The method includes conditioning a beam of radiation, patterning the beam of radiation, projecting the patterned beam of radiation onto a target portion of a substrate, and using an isolated reference frame to provide a reference surface. The reference frame includes a material having a coefficient of thermal expansion of greater than about $2.9 \times 10^{-6}$/K. The method also includes measuring the substrate with respect to the reference surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
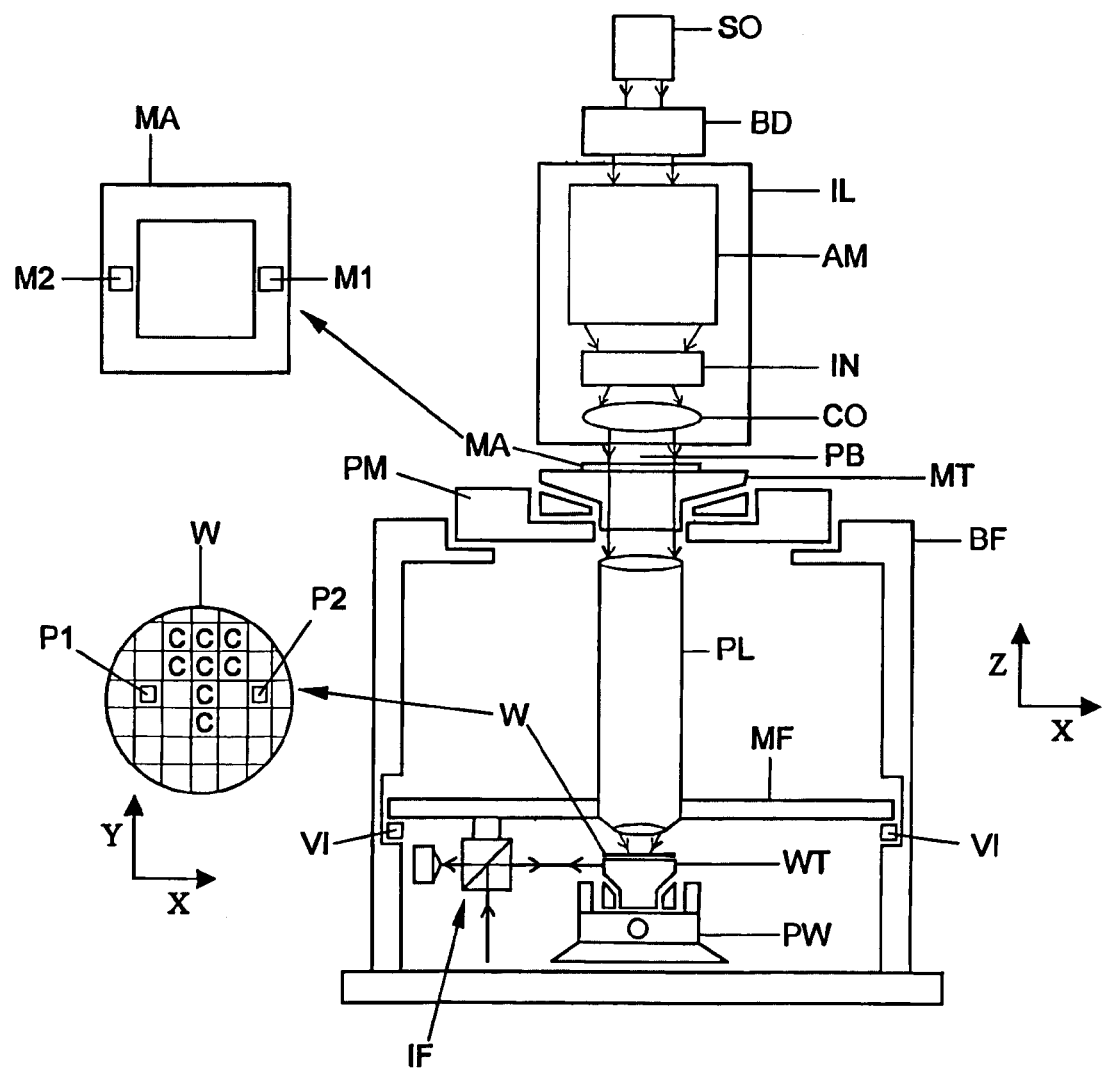
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV radiation or EUV radiation), a first support structure (e.g. a mask table) MT for supporting a patterning device (e.g. a mask) MA and connected to a first positioner PM for accurately positioning the patterning device with respect to item PL, a substrate table (e.g. a wafer table) WT for holding a substrate (e.g. a resist-coated wafer) W and connected to a second positioner PW for accurately positioning the substrate with respect to item PL, and a projection system (e.g. a refractive projection lens) PL for imaging a pattern imparted to the projection beam PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases, the source may be integral part of the apparatus, for example, when the source is a mercury lamp. The source SO and the illuminator IL, together with the beam delivery system BD if required, may be referred to as a radiation system.

The illuminator IL may include an adjuster AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator IL provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner), the mask table MT may be connected to a short stroke actuator only, or may be fixed. Mask MA and substrate W may be aligned using mask alignment marks M1, M2 and substrate alignment marks P1, P2.

The depicted apparatus can be used in the following example modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Also shown in FIG. 1 are two frames: a reference frame MF, which is also known as a so-called "metrology" frame, and a base frame BF. The reference frame MF provides a reference surface with respect to which the wafer is measured, and is mechanically isolated from the main apparatus structure. Typically, the reference frame MF is dynamically and thermally isolated. In particular, the reference frame MF is isolated from the base frame BF shown in FIG. 1. The reference frame MF supports sensitive components such as the interferometer IF and other position sensors. Additionally, depending on the particular lithographic apparatus, the reference frame may also support the projections system PL. Further, the reference frame isolates those components supported thereon from vibration. While the reference frame MF supports a metrology system, such as interferometer IF, and optionally also the projection system PL, the base frame supports other components. In particular, the base frame BF supports a vibration isolation system VI for mechanically isolating the reference frame MF from the main apparatus structure. Additionally, and optionally, the base frame may support other components, such as the wafer stage WT (not shown in FIG. 1) including the long stroke motor, and the reticle stage MT. In one embodiment, the base frame BF is in contact with the fabrication floor; alternatively, it is not. The vibration isolation system VI may be realized for example, as airmounts or other equivalent systems, such as a magnetic system, a mechanical system including low stiffness mechanical beams, or a fluid based system, which provide a resilient support for the reference frame MF with a low elastic coefficient. In an embodiment, the vibration isolation system is disposed between the base frame BF and the reference frame RF. It is noted that the airmounts are suitable for use in a lithographic apparatus operating under a vacuum or atmospheric conditions.

The reference frame MF may be, for example, a heavy table. According to the present invention, the reference frame MF is made of a material having a high coefficient of thermal expansion. Such materials may include, but are not limited to aluminium, aluminium alloy, titanium, iron, cast-iron, steel, stainless steel, copper, a ceramic material, concrete, granite, porcelain or combinations of these materials, for example, in a composite, sandwich or laminated structure. Table 1 below shows some typical properties of some suitable construction materials are shown. Additionally, to aid comparision, values of the same properties are shown for INVAR®, which is a conventional material.

TABLE 1

| Material | Coefficient of thermal expansion ($\times 10^{-6}$/K) | Specific heat (J/(kg K)) | Thermal conductivity (W/(m K)) | Mass density (kg/m$^3$) | Modules of elasticity (N/mm$^2$) |
|---|---|---|---|---|---|
| INVAR® (conventional) | 1.5 | 500 | 13 | 8030 | 140000 |
| Aluminium alloy (eg. AA5083 O) | 24 | 900 | 120 | 2660 | 71000 |
| Steel (eg. Fe 360) | 12 | 460 | 57 | 7850 | 210000 |
| Stainless steel (eg. 304(L) or 316(L)) | 16 | 500 | 16 | 7900 | 210000 |
| Cast iron (eg. GJS400-15) | 12 | 500 | 35 | 7100 | 170000 |
| Copper | 17 | 390 | 390 | 8900 | 120000 |
| Ceramic material (eg. SiSiC) | 3 | 700 | 170 | 2950 | 410000 |
| Porcelain | 2400 | 800 | 5 | 2400 | 104000 |
| Granite | 2650 | 820 | 3.5 | 2650 | 30000 |

It is further noted that aluminium alloys have a coefficient of thermal expansion typically in the region or around 23 to 24.5×10$^{-6}$/K.

The reference frame MF is built up from a monolithic part, in other words, a solid block. It may be cast or machined out of one block.

It has been found that a reference frame MF made in this way from aluminium, for example, has approximately the same mass as a conventional reference frame. Thus, its integration into the lithographic apparatus, in particular, with respect to its interface with the vibration isolation system VI, may be easily achieved. Further, it has been surprisingly found that the temperature environment around the reference frame is stable, which leads to an expected 2 nanometers drift over minutes for 5 meters, which matches the tolerances achieved by conventional reference frame materials, such as INVAR®, which have a much lower coefficient of thermal expansion than those materials considered according to the present invention. It has been found that the dynamic performance of the reference frame made from materials that might be expected to exhibit poor dynamic performance due to their higher coefficient of thermal expansion exhibit a dynamic performance within those tolerances required in conventional lithographic apparatus, contrary to expectations. Further, the center of gravity may readily be adapted without significant influence on the dynamical performance. In one alternative embodiment, the reference frame MF is provided that is heavier than conventional reference frames. This is achieved, for example, by increasing its dimensions and/or by selecting a material, such as iron, which has a higher density. It has been found that although such a heavier reference frame may require recalibration of the vibrational isolation system VI, it may provides the further advantage that the dynamic performance of the reference frame MF is improved.

One suitable material is aluminium alloy of the type AA5083 (Al-4.4Mg-0.7Mn-0.15Cr). It is noted with respect to AA5083 or similar alloys, that it may have the advantage that it has a very low internal stress level. This may provide advantages in terms of machining a block of the material to form a reference frame MF, and in terms of the long term stability of the reference frame.

It will be understood that, in addition, other aluminium based alloys may also be used.

With respect to the specific heat and the thermal conductivity, it has been found that the specific heat is preferably higher than about 600 J(kgK) and/or the thermal conductivity is preferably higher than about 20 W/(m K).

Optionally, a cooling system may be incorporated either in or on the reference frame MF to improve the thermal stability. A fluid cooling system, such as water or air cooling, may be used to cool the reference structure. According to the embodiments in which the projection system PL is supported by the reference frame MF, the cooling system may be adapted in or on the reference frame to additionally cool the projection system. In particular, a cooling system provides long term stability and provides short recovery time after thermal drift (for example, as experience after service, maintenance, installation, etc.).

Figure 2:
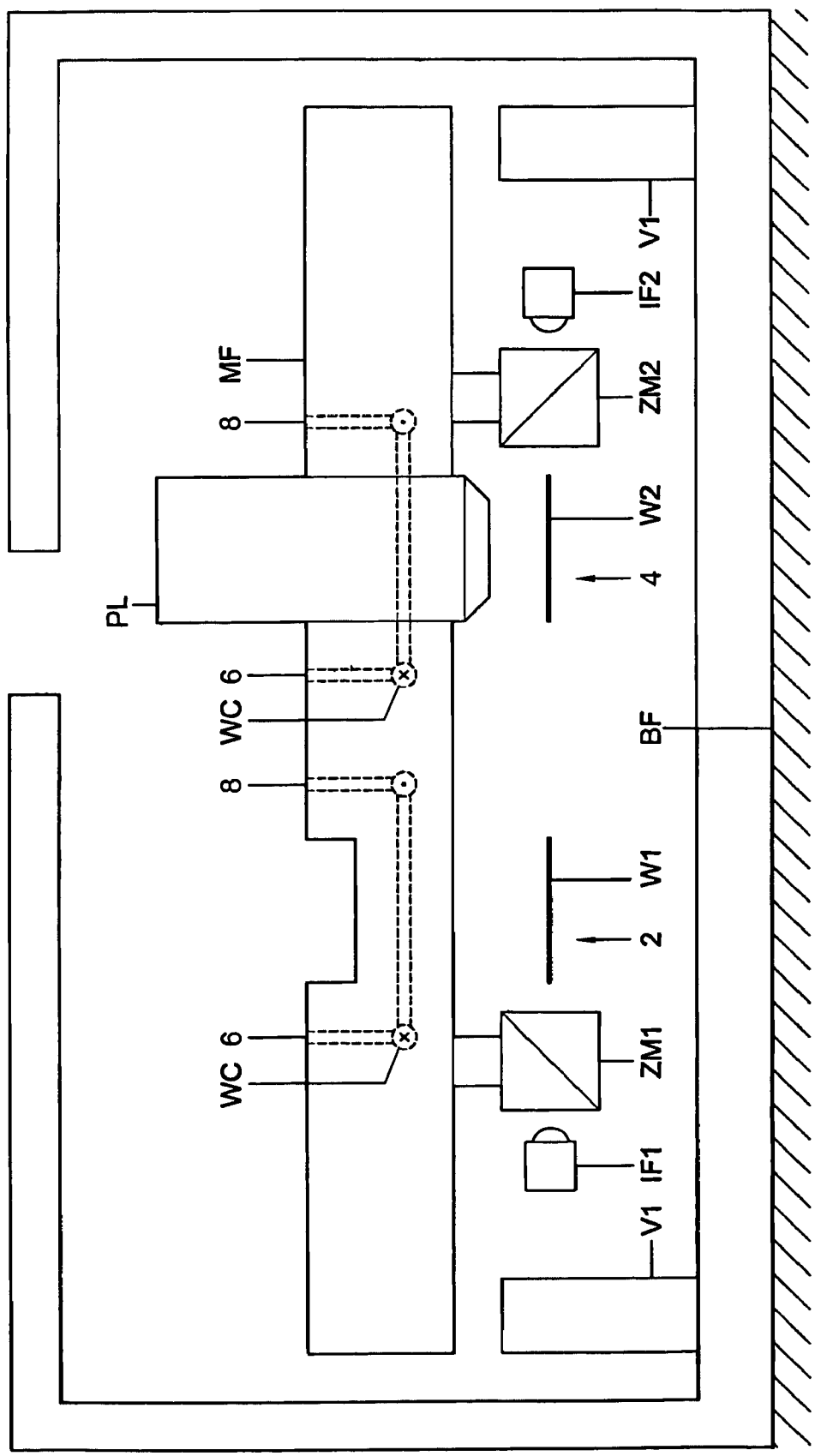
FIG. 2 depicts details of a lithographic apparatus according to a further embodiment of the invention.

FIG. 2 depicts details of a lithographic apparatus according to a further embodiment of the invention. In particular, FIG. 2 shows a reference frame MF which is suitable for use in a dual stage lithographic apparatus. A dual stage apparatus allows measurement at a measurement station 2 of one substrate W1 prior to exposure, while exposure at an exposure station 4 of a different substrate W2 takes place. While the substrate W1 is in the measurement station 2, a first interferometer IF1 including a first Z-mirror ZM1 is provided to produce a "substrate map" of the substrate, that is the interferometer IF1 maps the contours of the substrates surface, so that in the exposure stage distortions in the surface of the substrate can be compensated for. While the substrate W2 is at the exposure station 4, a second interferometer IF2 including a second Z-mirror ZM2 ensures that the "substrate map" produced in the measurement stage for substrate W2 is faithfully reproduced. In this particular embodiment, the reference frame MF supports both the metrology system IF and the projection system PL. In certain lithographic apparatus, the reference frame MF may include a first reference frame portion on which the components providing measuring functionality are mounted and a second reference frame portion on which the components providing the exposure measuring functionality are mounted. These two frame portions are then typically mounted, for example, by bolting either to each other or to an additional mounting frame. In embodiments where the reference frame includes more than one frame portion, each frame portion may be provided with its own vibration isolation system, respectively. Alternatively, a single vibration isolation system may be provided. FIG. 2 further shows an example of thermal conditioning system WC, for example, a cooling system, in particular a water cooling system WC which is formed in the reference frame MF. As shown, the reference frame MF is provided with ducts within the frame structure into which via inlets 6 a cooling liquid is introduced, and out of which via outlets 8 the cooling liquid leaves the structure. The ducts are formed so as to provide circulating cooling around that portion of the reference frame MF disposed opposite the measurement station 2 and exposure station 4, respectively. The cooling system includes one or more cooling circuits. In the particular embodiment shown in FIG. 2, two cooling circuits are shown. In an alternative embodiment, cooling may be provided by one cooling circuit. In an embodiment, a single cooling circuit may provide a cooling fluid to both the projection lens PL and the reference frame MF. The remaining components shown in FIG. 2 correspond to those shown and described with respect to FIG. 1 and are not described here further.

Figure 3:
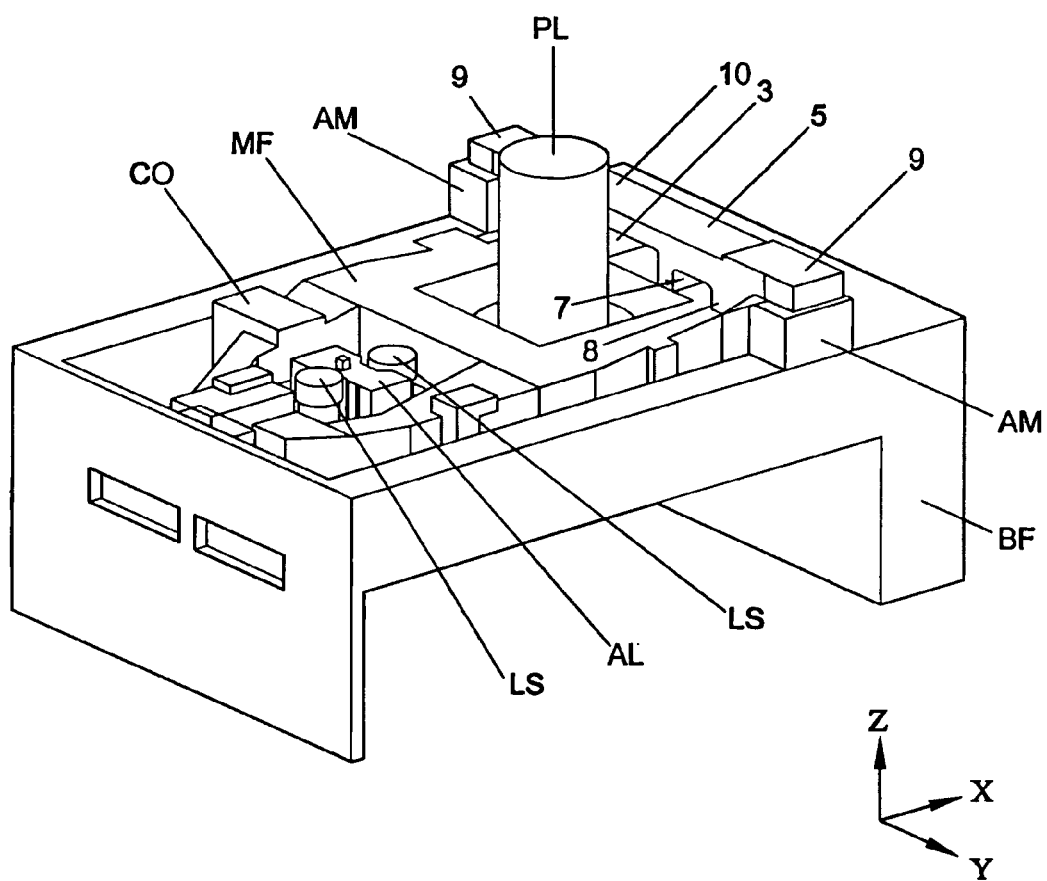
FIG. 3 depicts a top view of a reference frame isolated from a base frame according to an embodiment of the present invention showing certain components supported on the reference frame.

FIG. 3 depicts a top view of a reference frame isolated from a base frame according to an embodiment of the present invention showing certain components supported on the reference frame MF. In particular, FIG. 3 shows more detail with respect to the isolated relationship between the reference frame MF and the base frame BF and shows in greater detail the reference frame Mf and those components mounted thereon.

In the embodiment shown in FIG. 3, the reference frame MF includes a first portion 3 and a second portion 5. The first portion and the second portion are machined from first and second blocks respectively. Alternatively, they may be cast. The first and second portions 3, 5 cooperate with one another to form the reference frame MF. In particular, the first portion serves to support, inter alia, those components for carrying out the measuring stage and the exposing stage, for example, the projection lens PL, the level sensor module LS that senses the level of the substrate at the measuring position, and the alignment module AL, which assesses the alignment of the substrate at the measuring position. Other components may be mounted on the underside of the reference frame MF. These are described and shown with reference to FIG. 4. In the embodiment shown in FIG. 3, the second portion 5 supports the vibration isolation system VI, which serves to isolate the reference frame MF from the base frame BF. It is in the form of a bridge in which bridge support portions 7, 8 are disposed on the first portion 3. A portion 10 extending the length of the bridge is supported by bridge support portions 7, 8. At opposite ends 9 of the extending portion 10 are vibration isolation system supporting portions 9. The airmounts AM, which form the vibration isolation system VI in FIG. 3, are disposed between portions 9 and the base frame BF. Via the bridge 5, the vibration isolation from the base frame BF afforded by the airmounts AM is transferred to the components mounted on the first portion 3. In the embodiment shown in FIG. 3, three airmounts are provided: one at either end of the bridge portion, a third (not shown in FIG. 3, but shown in FIG. 4), is disposed between the reference frame MF and the base frame BF at the opposite end in a longitudinal direction of the first portion of the reference frame MF. The invention is not, however, limited in this respect, and it will be understood that the vibration isolation system VI may be realized in a number of alternative ways, with respect both to the nature of the system and the number and arrangement of the system components.

In an alternative embodiment to that shown in FIG. 3, the reference frame MF includes a single portion in which the functionalities described above with respect to the first and second portion are combined into a single portion.

The reference frame has a highly infrared reflective surface CO, which is also shown in FIG. 3. This may be achieved by applying a coating to at least a part of the outer surface of the reference frame. The coating covers the surface of the reference frame. It may cover at least the surface of a part of the reference frame MF. The coating may be of a metal material, such as nickel. Alternatively, a highly infrared reflective surface may be formed by polishing or surface treating the surface of the reference frame MF.

Figure 4:
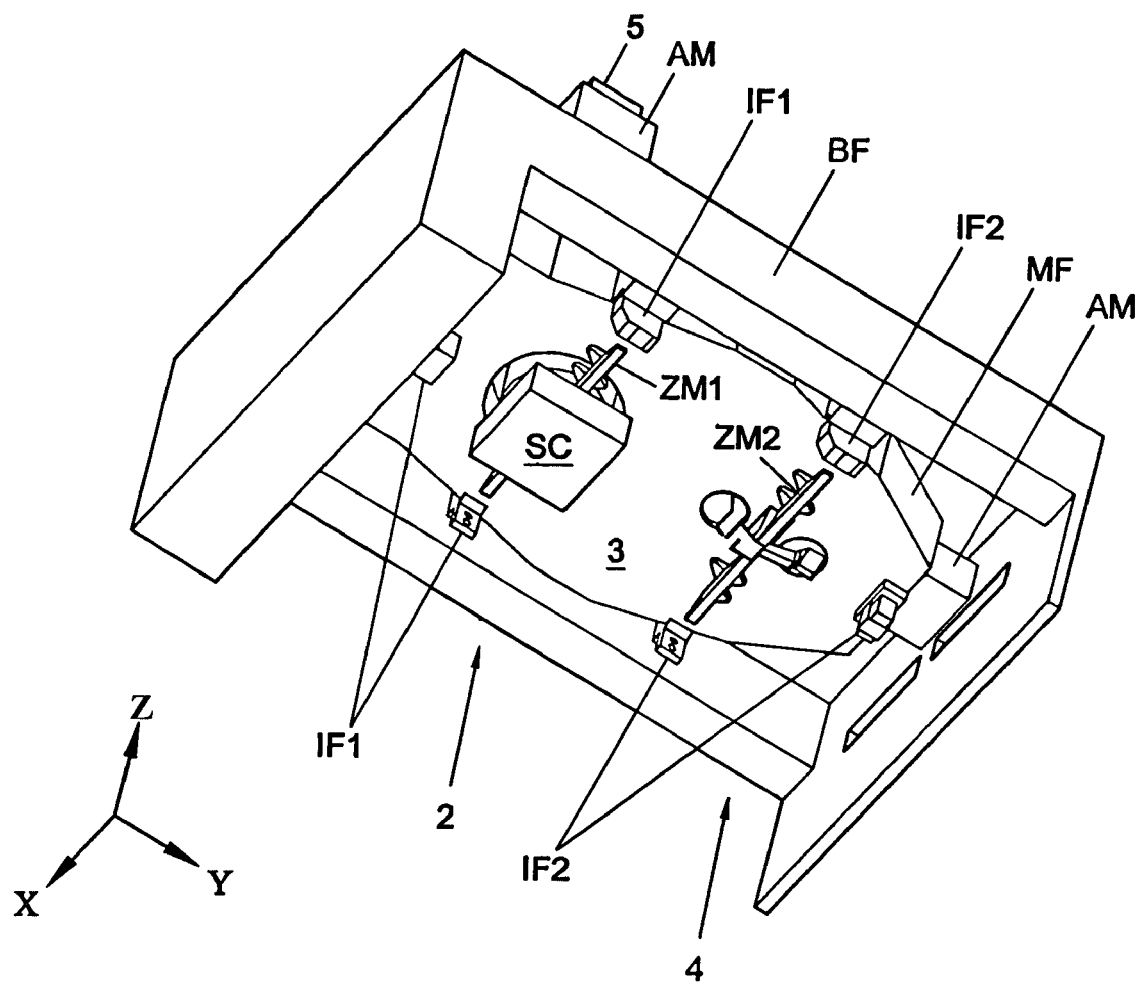
FIG. 4 depicts an underside view of the reference frame isolated from the base frame as shown in FIG. 3.

FIG. 4 depicts an underside view of the reference frame MF isolated from the base frame BF as shown in FIG. 3. In particular, those components mounted on the underside of the reference frame are shown. These include the interferometers IF1 arranged to carry out functions at the measuring station 2, and the interferometers IF2 arranged to carry out functions at the exposing station 4. Associated with each of these interferometers IF1, IF2 are associated Z-mirrors ZM1, ZM2, respectively. Also shown at the measuring station 2 is a substrate chuck SC which serves to support a substrate W. Once the measuring stage has been carried out, the substrate chuck SC moves from an aligned position with the measuring station 2 to an aligned position with respect to the exposing station 4. As mentioned previously, in one embodiment, two substrate chucks are provided on which respective substrates are supported. The chucks are positioned and moved with respect to one another so that a first substrate may be measured at the measuring station 2, while a second substrate is exposed at the exposing station 4. Such an arrangement increases the throughput of substrates through the lithographic apparatus.

In addition, FIG. 4 shows the vibrational isolation of the reference frame MF with respect to the base frame BF by virtue of a further airmount AM which is provided between part of the first portion 3 of the reference frame MF and the base frame BF. Also shown, is one of the airmounts AM that is mounted between the second portion 5 and the base frame BF.

It is desirable that the temperature control of the projection lens PL, the reference frame MF, interferometers IF and other sensors is at the milliKelvin level and below. For a reference frame MF made of a material such as aluminium, it may be desirable to have the temperature control in the order of 0.1 mK/5 minutes. It may be further desirable that the temperature stability of the environment of the projection lens PL, reference frame MF, interferometers IF, and other sensors be in the order of 30 mK. It has been found that conventional lithographic apparatus do not provide such temperature control.

In conventional lithographic apparatus, a temperature sensor is provided only on the projection system. Only such a lens sensor is used for determination of the temperature set point for the thermal conditioning system for the supply of water in a lens circuit water cabinet (LCWC), and a motor circuit water circuit (MCWC), and air in an air control cabinet (ACC). Due to the large time constant and because of the thermal isolation of the lens, it has been found that the lens is insensitive to environmental temperature fluctuations. On the other hand, the reference frame MF and other temperature critical components may be much more sensitive. Therefore, by sensing the temperature of the reference frame MF, as well as the projection lens, both long term and short term fluctuations may be detected and accounted for. In one embodiment of the present invention, a reference frame MF of a material such as aluminium, which has a high coefficient of thermal expansion, may be thermally conditioned, for example, with a water conditioning system. In a further embodiment, the reference frame MF may be conditioned with the same water that conditions the projection system, in particular, the projection lens. Because the aluminium reference frame MF is often more sensitive to environmental temperature fluctuations than a conventional reference frame, to compensate for a short term environmental temperature fluctuation, for example, the effect of actuator or a cover opening and closing, the temperature of the reference frame MF is sensed, and the temperature sensed is preferably used in the temperature control algorithm for compensation of the short term environmental temperature fluctuations. In a further embodiment, the temperature of the projection system PL is sensed with a sensor, for example, disposed on the projection lens. The temperature sensed is preferably used in combination with the temperature of the reference frame in the control algorithm for compensation of the long term environmental temperature fluctuations. It is desirable to control the long term temperature of the apparatus, because the temperature of, in particular, the projection system is preferably to be kept stable at an operating temperature. A typical operating temperature being around 22 degrees Celsius. It has been found that both the long and short term temperature fluctuations may be controlled in a single control loop, as described in more detail below.

Figure 5:
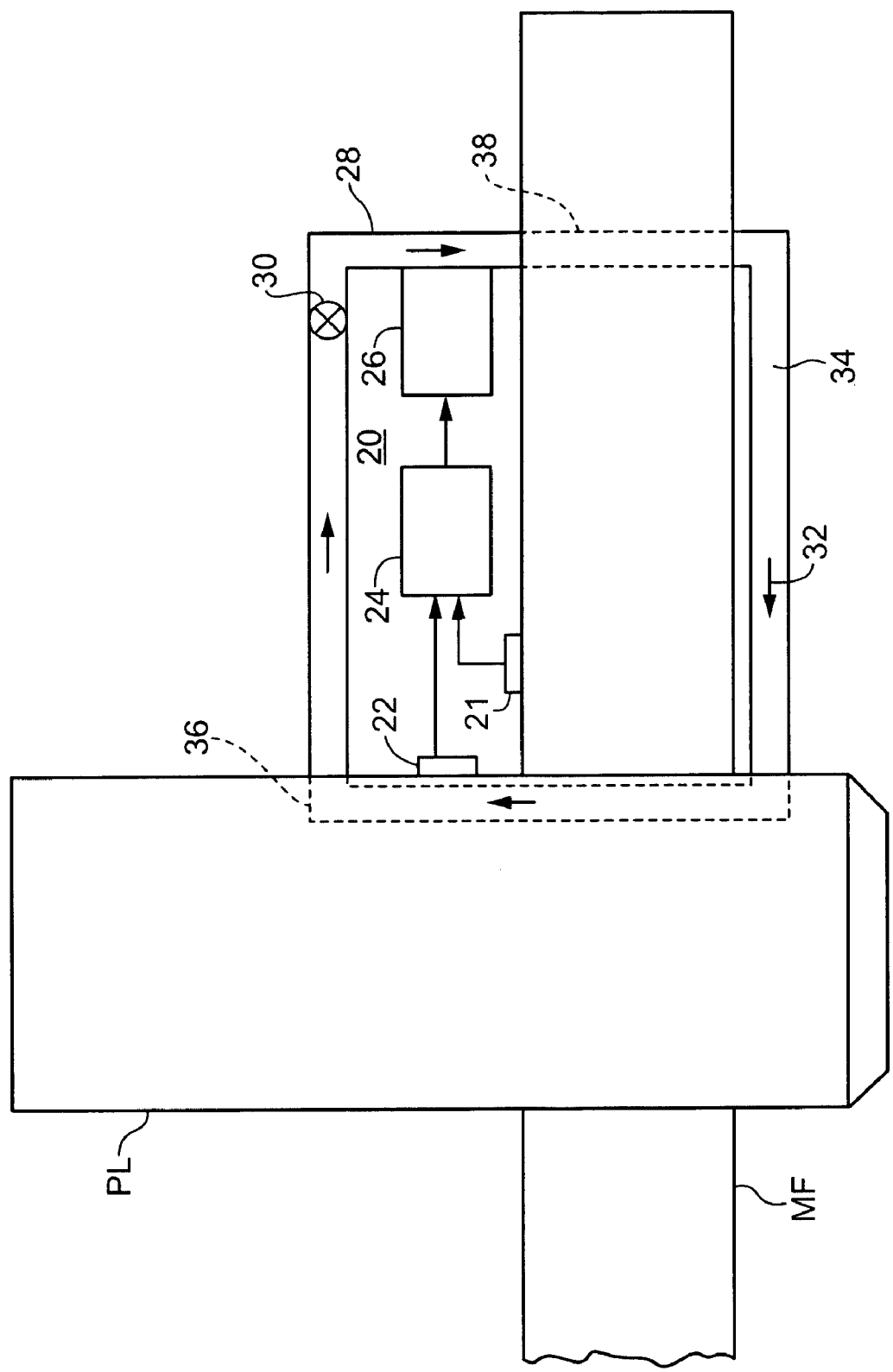
FIG. 5 depicts details of a reference frame and a projection lens and a thermal conditioning system.

FIG. 5 depicts details of a reference frame MF, a projection lens PL, and a thermal conditioning system 20. By controlling the temperature of, in particular, the reference frame MF and projection lens PL, the thermal stability of the lithographic apparatus may be improved. In particular, by controlling the temperature of the reference frame having a high coefficient of thermal expansion, of a material, such as aluminium, the thermal stability of the frame may be improved, because a reference frame MF of aluminium is more sensitive to environmental temperature fluctuations than conventional reference frames made of INVAR®.

In FIG. 5, a control loop is used to regulate the temperature of at least one of the projection lens PL and the reference frame MF. In this embodiment, at least one first temperature sensor 21 is provided for sensing a temperature of the reference frame MF. A further second temperature sensor 22 may be provided on the projection lens PL for sensing a temperature of the projection lens PL. The temperature sensors may include a device with a resistance that is dependent on a temperature. The thermal conditioning system 20 is provided for controlling the temperature of at least one of the reference frame MF and the projection system PL based on the temperatures sensed by at least one of the first and second temperature sensors 21, 22. In one embodiment, the temperature of the reference frame MF and the projection lens PL are controlled on the basis of the temperatures sensed by both the first and second temperature sensors 21, 22. The thermal conditioning system 20 includes a control circuit 24 for controlling an amount of heat transported to or from at least one of the reference frame MF and the projection lens PL. A temperature regulating element 26 is provided. The temperature regulating element 26 is arranged to heat and/or cool a fluid transported in a heat transporting system. The control circuit 24 is disposed between the temperature sensors 21, 22 and the temperature regulating element. The control circuit 24 is arranged to regulate the amount of heating so that a sensed temperature is regulated towards a set temperature. The control circuit 24 provides a control signal to the temperature regulating element 26 to control the heater and/or cooler depending on the control signal. The thermal conditioning system 20 further includes a heat transporting system 28, 30, 32, 34, 36, 38. The temperature regulating element 26 is disposed in thermal contact with a heat transporting system 28, 30, 32, 34, 36, 38. The temperature regulating system 26 regulates the amount of heat transported by the heat transporting system 28, 30, 32, 34, 36, 38. The heat transporting system 28, 30, 32, 34, 36, 38 is further disposed in thermal contact with at least one of the reference frame MF and the projection lens PL, for transporting heat to or from the at least one of the reference frame MF and the projection lens PL. In particular, the heat transporting system 28, 30, 32, 34, 36, 38 includes a supply duct 28, 36, 38 for supplying a conditioning medium 34 to the reference frame MF and the projection lens PL. The conditioning medium may be a fluid, such as water. The supply duct 28, 36, 38 is arranged to extend through portions of the reference frame MF and projection lens PL. In particular, the supply duct 38 includes an enclosed channel formed in the reference frame MF. The supply duct 36 includes an enclosed channel formed in the projection lens or projection system PL. The enclosed channels 36, 38 are arranged to extend within the reference frame MF and projection system PL so that they do not affect the functionality of these components. A circulation pump 30 is provided in the supply duct 28, 36, 38. In addition, or alternatively, to the cooling element of the temperature regulating system 26, a cooling element (not shown) upstream of the temperature regulating system 26 may be provided that is arranged to remove excess heat from the conditioning medium 34. In FIG. 5, one first and second temperature sensor 21, 22 are shown. In a further embodiment, a plurality of first temperature sensors and a plurality of second temperature sensors are provided. In this case, the average control circuit determines and regulates an average sensed temperature. The conditioning medium 34 may be cooled by a regulated amount instead of heated. In FIG. 5, the conditioning medium 34 is flowing sequentially through the reference frame MF and projection lens PL, in an alternative embodiment this flow can also be parallel towards the reference frame MF and the projection lens PL. In an alternative embodiment, a flow rate of the conditioning medium 34 may be regulated in order to control the heat transported by the heat transporting system. In a further alternative embodiment, rather than including a closed supply duct 28, as shown in FIG. 5, the supply duct 28 may include an open pipe through which fresh conditioning medium is introduced. The heat transport system does not require that the conditioning medium be circulated through the system.

In particular, the control circuit 24 is arranged to be responsive to the temperature sensed by at least one of the first and second temperature sensors 21, 22, the temperature regulating element 26 is responsive to the control circuit 24 and is in thermal contact with the heat transporting system 28, 30, 32, 34, 36, 38, so that a set temperature may be reached in at least one of the reference frame MF and the projection lens PL. In a further embodiment, the control circuit 20 is arranged to take the temperature sensed by the first temperature sensor 21 into account in compensating for a short term environmental temperature fluctuation. In this way, short term temperature fluctuations, such as the effect of the actuator opening and closing the covers, may be compensated for. In particular, short term environmental temperature effects on the reference frame are compensated to prevent short term thermal drift of the frame and sensors.

In a further embodiment, the control circuit 20 is arranged to take the temperature sensed by the second temperature sensor 22 into account in compensating for a long term environmental temperature fluctuation. In this way, the temperature of the projection lens PL may be maintained at a constant temperature, because for consistent imaging quality, it is desirable that the projection lens PL be maintained at a constant reference temperature. In particular, the lens may be maintained at a reference temperature of, for example, 22 degrees Celcius. In one embodiment, the compensation of short and long term fluctuations may be achieved in a single control loop. In a further embodiment, the heat transporting system 28, 30, 32, 34, 36, 38 transports heat to or from the reference frame MF and the projection lens PL. In this way, both the reference frame MF and projection lens PL are maintained at a predetermined set temperature without adding substantially to the complexity of the control of the lithographic apparatus. In one embodiment, a gas supply, such as an air shower, may provide a gas to a location between the projection system PL and the substrate W. A temperature of the gas supplied to the location may be determined by the temperature of the conditioning fluid. Because the airshower temperature is determined by the lens cooling water as supplied by supply duct 36, a more thermally stable overall system may be achieved.

Figure 6:
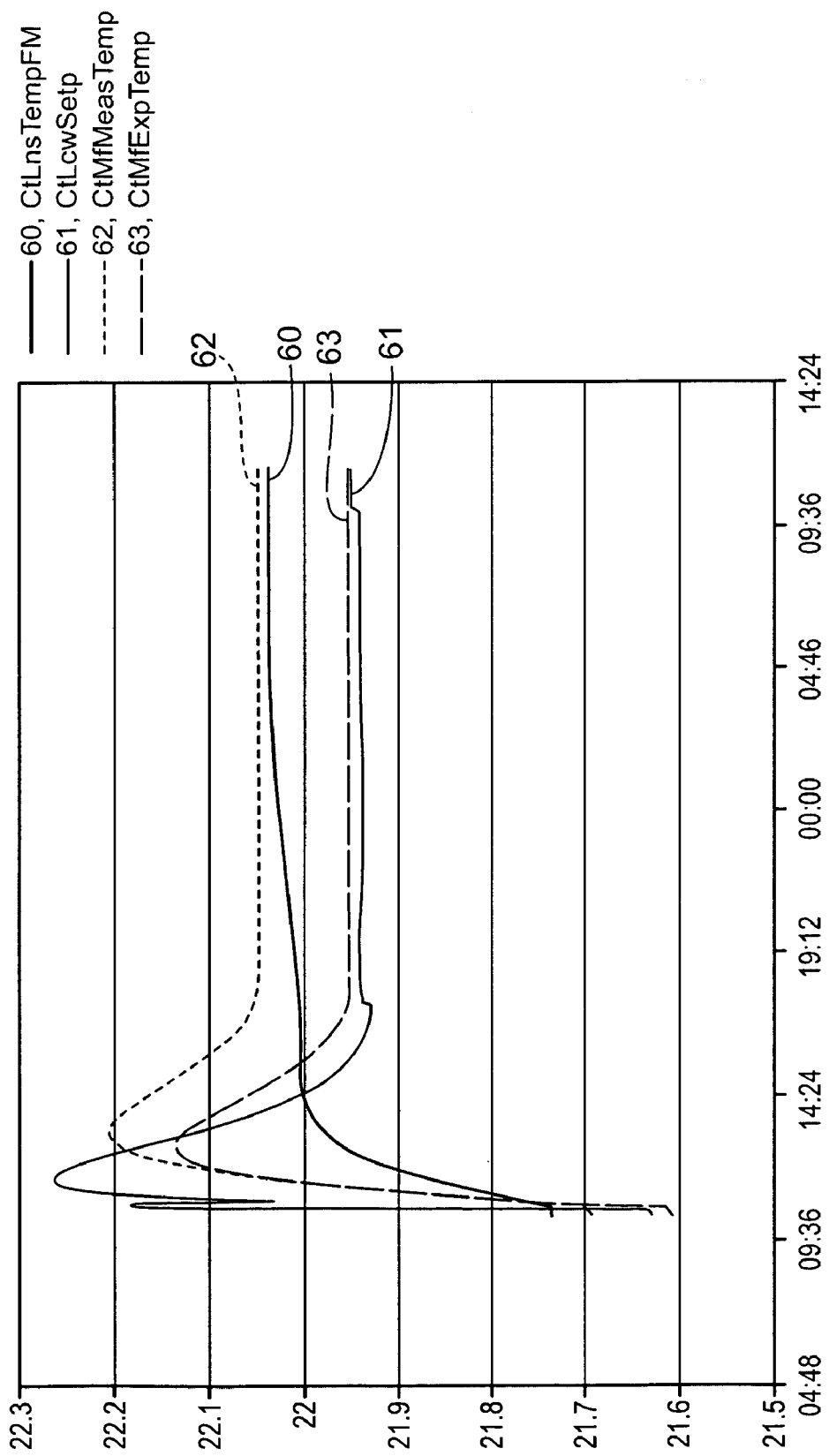
FIGS. 6–8 show results obtained according to an embodiment of the present invention.
Figure 7:
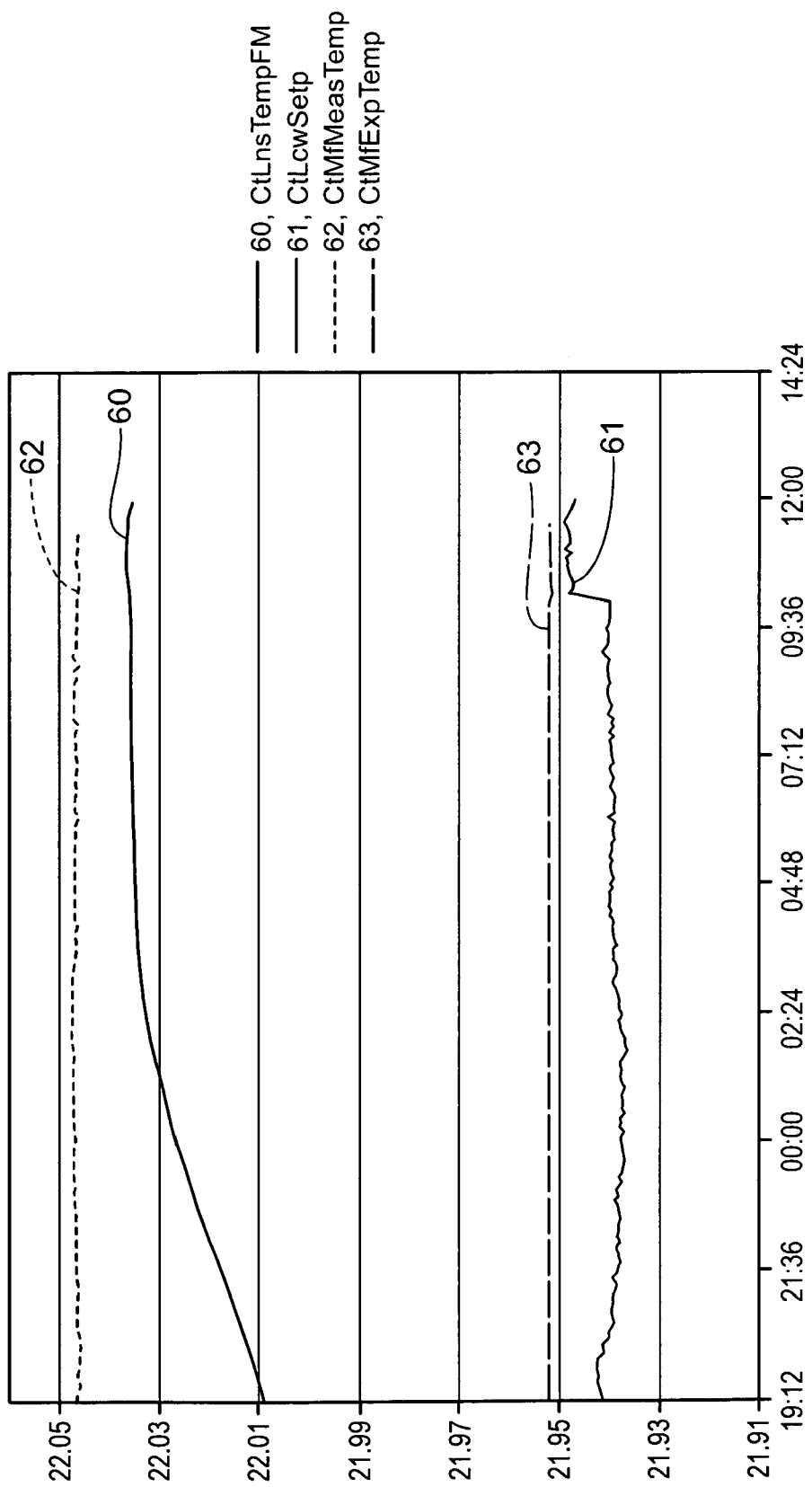
Figure 8:
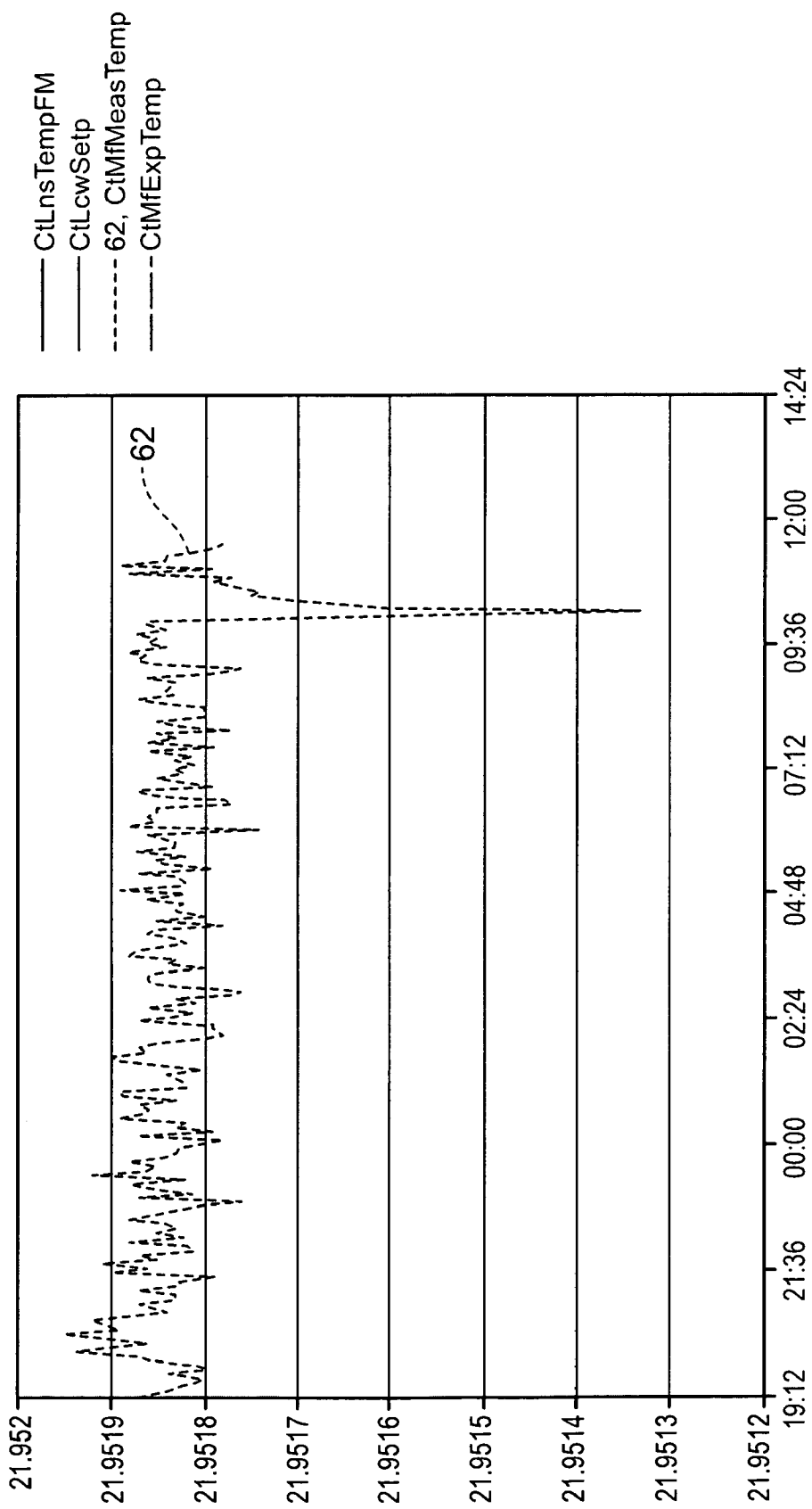

FIGS. 6–8 show results obtained according to an embodiment of the present invention. In FIGS. 6–8, the trace 60 is the lens temperature (CtLnsTempFM), trace 61 is the temperature of the setpoint of the lens cooling water (CtLcsSetp), trace 62 is the temperature of the reference frame at the measure side (CtMfMeasTemp), and trace 63 is the temperature of the reference frame at the expose side (CtMfExpTemp).

FIG. 6 shows experimental results achieved according to an embodiment of the present invention, in which the reference frame MF was aluminium. In particular, in FIG. 6, the temperature recovery is achieved using the lens sensor 22 and during exposure of a substrate W, the reference frame MF sensor 21 is used. It is seen that the long term drift of the lens PL is not corrected in this measurement. In an embodiment, both the sensor 21, which senses the temperature of the reference frame MF, and the sensor 22, which senses the temperature of the projection lens PL, are used in the control algorithm to prevent this long term lens temperature drift observed in FIG. 6.

FIG. 7 shows a detail of the results shown in FIG. 6. In particular, FIG. 7 shows the results around the exposure phase. The correction for the short term experimental drift can be seen. At around 20.00 h, an exposure was started resulting in an environmental temperature increase of about 20 mK, this results in a temperature decrease of the LCW setpoint. Around 10.00 h, the covers were removed from the electronic cabinets resulting in a sudden decrease of the environmental air. This is accounted for by the control by a sudden temperature increase of the set point. As shown in FIG. 7, the temperature of the reference frame MF is seen to remain stable.

FIG. 8 shows a detail of the results shown in FIG. 6. In particular, FIG. 8 shows the experimental results zoomed in at the reference frame MF temperature. It can be seen that at all times, the temperature fluctuation are in the order of 0.1 mK, which corresponds to a measurement error of 1 nm, except when the covers are removed. The removal of the covers may be regarded as an exceptional situation. Even then, the results shown in FIG. 8 show that it does not take long to recover from this action.

While specific embodiments of the invention have been described above, it will be appreciated that the invention may be practiced otherwise than as described. The description is not intended to limit the invention.

What is claimed is:

1. A lithographic apparatus comprising:
an illumination system for conditioning a beam of radiation;
a support for supporting a patterning device, the patterning device serving to impart the beam of radiation with a pattern in its cross-section;
a substrate table for holding a substrate;
a projection system for projecting the patterned beam onto a target portion of the substrate;
an isolated reference frame for providing a reference surface; and
a measuring system for measuring at least one dimension of the substrate with respect to said reference surface, wherein said reference frame comprises a material having a coefficient of thermal expansion of greater than about $2.9 \times 10^{-6}$/K.

2. A lithographic apparatus according to claim 1, wherein said reference frame supports the measuring system for measuring the at least one dimension of said substrate prior to its exposure.

3. A lithographic apparatus according to claim 1, wherein said reference frame supports said projection system.

4. A lithographic apparatus according to claim 1, wherein said reference frame comprises a material from the group consisting of: aluminium, aluminium alloy, titanium, iron, cast-iron, steel, stainless steel, copper, a ceramic material, concrete, granite, and porcelain.

5. A lithographic apparatus according to claim 4, wherein the reference frame is a composite, sandwich, or laminated structure.

6. A lithographic apparatus according to claim 1, wherein said reference frame comprises a solid block of material.

7. A lithographic apparatus according to claim 6, wherein said solid block is machined to form said reference frame.

8. A lithographic apparatus according to claim 7, wherein said reference frame comprises a first and second portion.

9. A lithographic apparatus according to claim 8, wherein said apparatus further comprises a vibration isolation system provided for at least one of said first and said second portions for isolating at least one of said first portion and said second portion, respectively, from vibrations generated in said apparatus.

10. A lithographic apparatus according to claim 1, wherein said reference frame is provided with a thermal conditioning system for controlling the temperature of said projection system with respect to said reference frame.

11. A lithographic apparatus according to claim 10, wherein said thermal conditioning system conditions said reference frame and said projection lens with a conditioning fluid.

12. A lithographic apparatus according to claim 1, wherein said reference frame is provided with a highly infrared reflective surface.

13. A lithographic apparatus according to claim 12, wherein said surface is provided by a coating of a metal.

14. A lithographic apparatus according to claim 13, wherein the metal comprises nickel.

15. A lithographic apparatus according to claim 1, wherein said reference frame is made of a material having a specific heat of greater than about 600 J/(kgK) and/or having a thermal conductivity of greater than about 20 W/(mK).

16. A lithographic apparatus according to claim 1, wherein said apparatus further comprises a vibration isolation system provided for said reference frame for isolating said reference frame from vibrations generated in said apparatus.

17. A lithographic apparatus according to claim 9, wherein said apparatus further comprises a base frame for supporting said vibrational isolation system.

18. A lithographic apparatus according to claim 1, wherein said reference frame is provided with a first temperature sensor for sensing a temperature of said reference frame.

19. A lithographic apparatus according to claim 18, wherein said projection system comprises a projection lens, wherein said projection lens is provided with a second temperature sensor for sensing a temperature of said projection lens.

20. A lithographic apparatus according to claim 19, further comprising a thermal conditioning system for thermally conditioning said reference frame and/or said projection system based on the temperatures sensed by said first and/or second temperature sensors.

21. A lithographic apparatus according to claim 20, wherein said thermal conditioning system comprises:
   a control circuit for controlling an amount of heat transported to or from said reference frame and/or said projection lens;
   a temperature regulating element; and
   a heat transporting system, wherein the temperature regulating element regulates the amount of heat transported by said heat transporting system, wherein said heat transporting system is in thermal contact with said reference frame and/or said projection lens, for transporting heat to or from said reference frame and/or said projection lens, wherein said control circuit is arranged to be responsive to the temperature sensed by said first and/or second temperature sensors, said temperature regulating element being responsive to said control circuit and in thermal contact with said heat transporting system, so that a set temperature is reached in said reference frame and/or said projection lens.

22. A lithographic apparatus according to claim 21, wherein said control circuit is arranged to take the temperature sensed by said first temperature sensor into account in compensating for a short term environmental temperature fluctuation.

23. A lithographic apparatus according to claim 21, wherein said control circuit is arranged to take the temperature sensed by said second temperature sensor into account in compensating for a long term environmental temperature fluctuation.

24. A lithographic apparatus according to claim 21, wherein said thermal conditioning system comprises a single control loop for controlling the temperature of said reference frame and said projection lens.

25. A lithographic apparatus according to claim 21, wherein said heat transporting system comprises a conditioning fluid which is heated or cooled to said set temperature.

26. A lithographic apparatus according to claim 25, further comprising a gas supply for providing a gas to a location between said projection system and said substrate, wherein a temperature of the gas supplied to the location is determined by the temperature of said conditioning fluid.

27. A device manufacturing method comprising:
   conditioning a beam of radiation;
   patterning the beam of radiation;
   projecting the patterned beam of radiation onto a target portion of a substrate;
   using an isolated reference frame to provide a reference surface, said reference frame comprising a material having a coefficient of thermal expansion of greater than about $2.9 \times 10^{-6}$/K; and
   measuring at least one dimension of the substrate with respect to the reference surface.

* * * * *